United States Patent
Drazek et al.

(10) Patent No.: US 12,473,198 B2
(45) Date of Patent: *Nov. 18, 2025

(54) METHOD FOR PREPARING THE REMAINDER OF A DONOR SUBSTRATE, SUBSTRATE PRODUCED BY SAID METHOD, AND USE OF SUCH A SUBSTRATE

(71) Applicant: Soitec, Bernin (FR)

(72) Inventors: Charlotte Drazek, Grenoble (FR); Djamel Belhachemi, Saint Martin d'heres (FR)

(73) Assignee: Soitec, Bernin (FR)

( * ) Notice: Subject to any disclaimer, the term of this patent is extended or adjusted under 35 U.S.C. 154(b) by 370 days.

This patent is subject to a terminal disclaimer.

(21) Appl. No.: 18/055,040

(22) Filed: Nov. 14, 2022

(65) Prior Publication Data

US 2023/0073003 A1    Mar. 9, 2023

Related U.S. Application Data

(63) Continuation of application No. 16/770,013, filed as application No. PCT/FR2018/052938 on Nov. 21, 2018, now Pat. No. 11,542,155.

(30) Foreign Application Priority Data

Dec. 5, 2017 (FR) ........................................ 1761674

(51) Int. Cl.
*H01L 21/02* (2006.01)
*B81C 1/00* (2006.01)
*H01L 21/762* (2006.01)

(52) U.S. Cl.
CPC .... *B81C 1/00357* (2013.01); *H01L 21/02021* (2013.01); *H01L 21/76254* (2013.01); *H01L 21/76259* (2013.01); *B81C 2201/0192* (2013.01)

(58) Field of Classification Search
CPC ......... H01L 21/76254; H01L 21/02032; H01L 21/02002; H01L 21/76259; H01L 21/02021; B81C 2201/0192
See application file for complete search history.

(56) References Cited

U.S. PATENT DOCUMENTS 5,233,218 A * 8/1993 Miura ............... H01L 21/76251
257/629
5,668,045 A * 9/1997 Golland ............ H01L 21/76251
148/DIG. 135

(Continued)

FOREIGN PATENT DOCUMENTS

| CN | 101689530 A | 3/2010 |
| CN | 101791780 A | 8/2010 |

(Continued)

OTHER PUBLICATIONS

Chinese First Office Action for Chinese Application No. 201880084235, dated Feb. 27, 2023, 12 pages with translation.

(Continued)

*Primary Examiner* — Mohsen Ahmadi
(74) *Attorney, Agent, or Firm* — TraskBritt

(57) ABSTRACT

A method is used to prepare the remainder of a donor substrate, from which a layer has been removed by delamination in a plane weakened by ion implantation. The remainder comprises, on a main face, an annular step corresponding to a non-removed part of the donor substrate. The method comprises the deposition of a smoothing oxide on the main face of the remainder in order to fill the inner space defined by the annular step and to cover at least part of the (Continued)

annular step, as well as heat treatment for densification of the smoothing oxide. A substrate is produced by the method, and the substrate may be used in subsequent processes.

20 Claims, 3 Drawing Sheets

(56) References Cited

U.S. PATENT DOCUMENTS

| | | | |
|---|---|---|---|
| 5,937,312 A * | 8/1999 | Iyer | H01L 21/3226 438/455 |
| 6,245,678 B1 | 6/2001 | Yamamoto et al. | |
| 6,284,628 B1 * | 9/2001 | Kuwahara | H01L 21/2007 438/959 |
| 6,309,950 B1 | 10/2001 | Forbes | |
| 6,426,270 B1 * | 7/2002 | Sakaguchi | H01L 21/76259 438/455 |
| 6,482,749 B1 * | 11/2002 | Billington | H01L 21/02021 257/E21.309 |
| 7,402,520 B2 * | 7/2008 | Donohoe | H01L 21/02032 438/690 |
| 8,357,587 B2 * | 1/2013 | Schwarzenbach | H01L 21/02032 257/E29.022 |
| 8,852,391 B2 | 10/2014 | Mccutcheon et al. | |
| 9,123,529 B2 * | 9/2015 | Hanaoka | H01L 21/76254 |
| 2004/0081790 A1 * | 4/2004 | Maleville | H01L 21/76254 438/455 |
| 2004/0110378 A1 | 6/2004 | Ghyselen et al. | |
| 2005/0026391 A1 * | 2/2005 | Ghyselen | H01L 21/76254 438/455 |
| 2005/0164471 A1 | 7/2005 | Maleville | |
| 2006/0115986 A1 | 6/2006 | Donohoe et al. | |
| 2008/0124930 A1 * | 5/2008 | Lim | C09G 1/02 438/692 |
| 2008/0242048 A1 * | 10/2008 | Nakai | H01L 21/76243 438/440 |
| 2009/0061545 A1 | 3/2009 | Donohoe et al. | |
| 2010/0022070 A1 * | 1/2010 | Imahayashi | H01L 21/76254 257/E21.568 |
| 2010/0181653 A1 | 7/2010 | Aulnette et al. | |
| 2010/0190416 A1 | 7/2010 | Schwarzenbach et al. | |
| 2010/0200854 A1 * | 8/2010 | Alami-Idrissi | H01L 21/02032 257/618 |
| 2010/0219500 A1 | 9/2010 | Morita et al. | |
| 2011/0076849 A1 * | 3/2011 | Blanchard | H01L 21/304 216/33 |
| 2011/0140244 A1 * | 6/2011 | Schwarzenbach | H01L 21/02032 257/E29.022 |
| 2014/0113452 A1 | 4/2014 | Lin et al. | |
| 2014/0264765 A1 | 9/2014 | Masuda | |
| 2016/0196995 A1 | 7/2016 | Onishi | |
| 2017/0098539 A1 | 4/2017 | Shatalov et al. | |
| 2017/0186600 A1 * | 6/2017 | Ostermaier | C30B 33/08 |
| 2018/0033609 A1 * | 2/2018 | Henley | H01L 21/02002 |
| 2018/0040765 A1 | 2/2018 | Henley et al. | |
| 2018/0076043 A1 * | 3/2018 | Ito | B23K 26/0823 |
| 2019/0148130 A1 * | 5/2019 | Chiang | H01L 21/30604 257/797 |

FOREIGN PATENT DOCUMENTS

| | | |
|---|---|---|
| CN | 101866824 A | 10/2010 |
| JP | 11-297583 A | 10/1999 |
| JP | 2010-177664 A | 8/2010 |
| JP | 2010-186987 A | 8/2010 |
| KR | 10-2002-0085361 A | 11/2002 |
| KR | 10-2005-0039864 A | 4/2005 |
| KR | 10-2005-0069988 A | 7/2005 |
| WO | 2004/019404 A2 | 3/2004 |

OTHER PUBLICATIONS

Chinese Search Report for Chinese Application No. 201880084235, dated Feb. 27, 2023, 1 page.
Japanese Decision to Grant a Patent for Japanese Application No. 2020-530620, dated Feb. 21, 2023, 5 pages with English translation.
Japanese Notice of Reasons for Refusal for Japanese Application No. 2020-530620, dated Dec. 6, 2022, 4 pages with English translation.
Korean Request for the Submission of an Opinion received for Korean Patent Application No. 10-2020-7016877, dated Dec. 20, 2022, 6 pages With English Translations.
Korean Written Decision on Registration received for Korean Patent Application No. 10-2020-7016877, dated Jun. 22, 2023, 5 pages With English Translations.
International Search Report for International Application No. PCT/FR2018/052938 dated Feb. 13, 2019, 2 pages.
International Written Opinion for International Application No. PCT/FR2018/052938 dated Feb. 13, 2019, 6 pages.

* cited by examiner

METHOD FOR PREPARING THE REMAINDER OF A DONOR SUBSTRATE, SUBSTRATE PRODUCED BY SAID METHOD, AND USE OF SUCH A SUBSTRATE

CROSS-REFERENCE TO RELATED APPLICATIONS

This application is a continuation of U.S. patent application Ser. No. 16/770,013, filed Jun. 4, 2020, now U.S. Pat. No. 11,542,155, issued Jan. 3, 2023, which is a national phase entry under 35 U.S.C. § 371 of International Patent Application PCT/FR2018/052938, filed Nov. 21, 2018, designating the United States of America and published as International Patent Publication WO 2019/110885 A1 on Jun. 13, 2019, which claims the benefit under Article 8 of the Patent Cooperation Treaty to French Patent Application Serial No. 1761674, filed Dec. 5, 2017, the disclosure of each of which is hereby incorporated herein in its entirety by this reference.

TECHNICAL FIELD

The present disclosure relates to a method for preparing the remainder of a donor substrate. The substrates produced by this method can be used to form an inexpensive structure on insulator of SOI type, for example, for use in the field of microelectronics, for the manufacture of MEMS, etc.

BACKGROUND

Smart Cut™ technology is a technology widely used in the semiconductor field for the formation of a thin layer on a support substrate. This technology enables the removal of a thin layer from one face of a donor substrate by fracturing at a weakened plane (or fracture plane) formed by implanting light species. The donor substrate remaining after the transfer of the thin layer is referred to as "remainder" and generally comprises an annular step corresponding to the non-removed part of the face of the donor substrate.

The present disclosure relates more particularly to the preparation of such a remainder in order to make it reusable. Such methods for preparing a remainder produced by the Smart Cut™ method are known. Mention may be made, by way of example, of documents US20090061545, US20100200854. These methods are generally complex and comprise the removal of the annular step. A conventional method of the prior art comprises the following steps: a first polishing to partially remove the annular step from the remainder, then a "double-sided polishing" (polishing of both faces simultaneously), followed by a chemical polishing in order to entirely remove the step and obtain a surface with satisfactory surface properties for subsequent use. These methods may also comprise other additional steps such as a deoxidation.

The methods of the prior art are often expensive, long and may lead to a significant loss of material, in particular, for the methods based on "double-sided polishing." Depending on the subsequent use, which will be made of the remainder, it may be beneficial to reduce this loss of materials.

BRIEF SUMMARY

One aim of the present disclosure is to propose a method for preparing a remainder of a donor substrate that at least partly solves the above-mentioned problem. The aim of the present disclosure is more particularly a simpler, less expensive preparation method that causes less loss of material than those known in the art.

With a view to achieving this aim, the present disclosure proposes a method for preparing the remainder of a donor substrate, a layer having been removed from the donor substrate by delamination in a plane weakened by ion implantation, the remainder comprising, on a main face, an annular step corresponding to a non-removed part of the donor substrate, the method comprising the deposition of a smoothing oxide on the main face of the remainder in order to fill the inner space defined by the annular step and to cover at least part of the annular step, as well as heat treatment for densification of the smoothing oxide.

According to other advantageous non-limiting features of embodiments of the present disclosure, taken alone or according to any technically feasible combination:
- the smoothing oxide belongs to the SOG (Spin-On Glass) family;
- the densification heat treatment has a temperature of between 225° C. and 900° C.;
- the densification heat treatment is carried out under a nitrogen (N2) atmosphere;
- the deposition of smoothing oxide is carried out under conditions leading to the formation of a layer having a thickness at least equal to one and a half times the height of the annular step;
- the method comprises a step of preparing the main surface of the remainder, before the deposition step;
- the step of preparing the main surface of the remainder comprises the removal of a peripheral zone of the main surface damaged by ion implantation.

The present disclosure also relates to a substrate comprising a remainder of a donor substrate, a layer having been removed from the donor substrate by delamination in a plane weakened by ion implantation, the remainder comprising on a main face an annular step corresponding to a non-removed part of the donor substrate, the substrate also comprising an oxide layer on the main face of the remainder, the oxide layer filling the inner space defined by the annular step and covering at least part of the annular step.

According to other advantageous non-limiting features of embodiments of the present disclosure, taken alone or according to any technically feasible combination:
- the oxide layer has a thickness at least equal to one and a half times the height of the annular step;
- the remainder comprises a surface oxide layer;
- the donor substrate consists of silicon.

The present disclosure also relates to the use of a substrate, which comprises providing a substrate prepared as specified above, assembling the substrate with a donor substrate and thinning the donor substrate to form a structure on insulator (for example, of the silicon-on-insulator (SOI) type).

The assembly may comprise a heat treatment at a temperature of between 100° C. and 500° C.

BRIEF DESCRIPTION OF THE DRAWINGS

Other features and advantages of embodiments of the present disclosure will emerge from the following detailed description of examples of embodiments of the present disclosure with reference to the appended figures, in which.

DETAILED DESCRIPTION

Figure 1A:
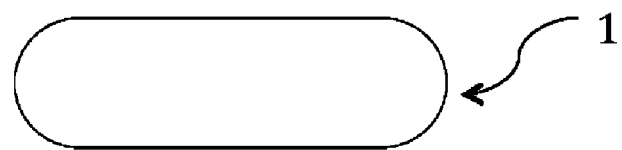
FIGS. 1A-1E depict the various steps of an example of a layer removal method.

For the sake of simplifying the following description, the same references are used for elements that are identical or perform the same function.

The figures are schematic depictions, which, for the sake of readability, are not to scale.

The present disclosure relates to a method for preparing the remainder of a donor substrate in order to make it usable.

This remainder is generally obtained following the removal, from the donor substrate 1, of a thin layer 5 by delamination in a plane 3 weakened by ion implantation, the remainder 1' comprising, on a main face 10, an annular step 11 corresponding to a non-removed part of the donor substrate 1. The thin layer 5 is transferred to a support substrate 4.

The donor substrate 1 and the support substrate 4 may consist of any materials. This may be a semiconductive material (such as silicon, SiGe, germanium, gallium nitride), an insulator (such as sapphire or glass) or a piezoelectric material (such as lithium tantalate or lithium niobate).

The donor substrate 1 and/or the support substrate 4 may be provided with a surface insulator layer 2 comprising, for example, a silicon or aluminum oxide, or a silicon or aluminum nitride. It may thus have been formed by deposition, oxidation or nitriding, as appropriate.

The donor substrate 1 and the support substrate 4 may advantageously be disk-shaped silicon wafers, the diameter of which is typically 200 mm, 300 mm or even 450 mm. At least one of these wafers may have a surface insulator layer, such that a silicon-on-insulator wafer is obtained at the end of the method. However, the present disclosure is not limited to these materials, this shape or these dimensions alone.

FIG. 1 depicts the various steps of an example of a layer removal method of the Smart Cut type, resulting in the remainder 1' used in embodiments of the present disclosure.

Figure 1B:
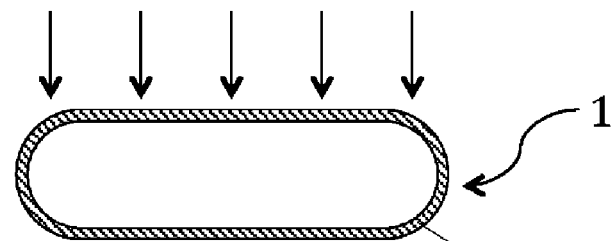

This type of method comprises providing a donor substrate 1, illustrated by FIG. 1A, optionally followed by a step of oxidation of the donor substrate 1 illustrated by FIG. 1B with the formation of a surface oxide layer 2 as described previously.

Figure 1C:
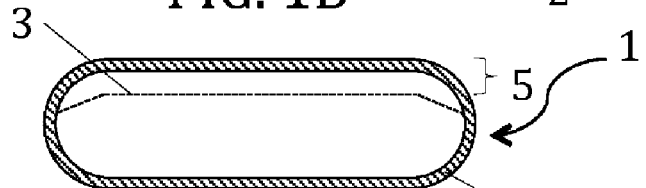

Next, a first step, illustrated by FIG. 1C, of formation of a plane 3 weakened by implantation of light species into the donor substrate 1 is carried out, so as to form a thin layer 5 between this plane and the implanted surface of the donor substrate 1. The weakened plane 3 is typically produced by implantation of hydrogen and/or of noble gas. Thus, the light species may be selected from hydrogen and helium ions at doses of between 5e15 and 1e17 at/cm$^2$.

As regards the implantation energy, it is typically between 10 keV and 200 keV and defines the implantation depth of the ions.

Figure 1D:
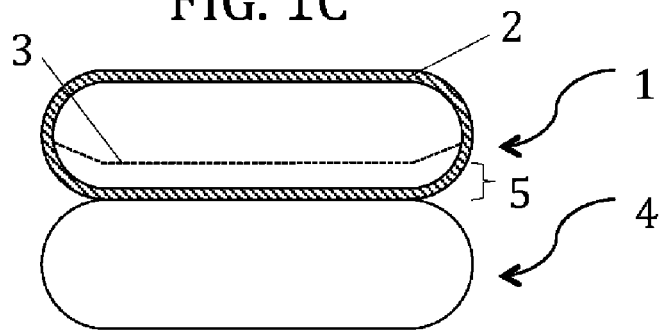

In a second step, illustrated by FIG. 1D, subsequent to the first step, the support substrate 4 is assembled with the implanted surface of the donor substrate 1, to form an assembly to be fractured. This assembly is preferentially produced by molecular adhesion, i.e., by direct adhesion of the surfaces to one another without adding adhesive material (aside from water), and by using adhesion forces mainly of the van der Waals or covalent type.

The assembly step may be preceded by any prior surface treatment of the donor substrate 1 and of the support substrate 4, such as one or more cleaning operations, plasma activation, etc.

Figure 1E:
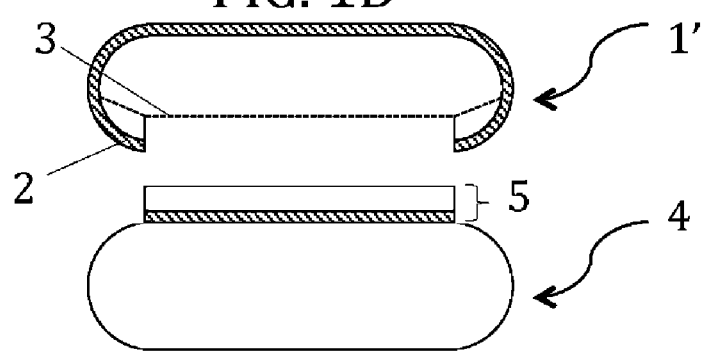

In a following step, illustrated by FIG. 1E, the assembly to be fractured is subject to a fracturing heat treatment step. This step aims to develop microcavities, platelets, and/or other types of defects that are precursors to the fracture in the weakened plane 3. It leads to the initiation and propagation of the fracture wave along the weakened plane 3 so as to transfer the thin layer 5 to the support substrate 4.

This fracturing heat treatment may also help to strengthen the degree of adhesion between the donor substrate 1 and the support substrate 4.

Figure 2:
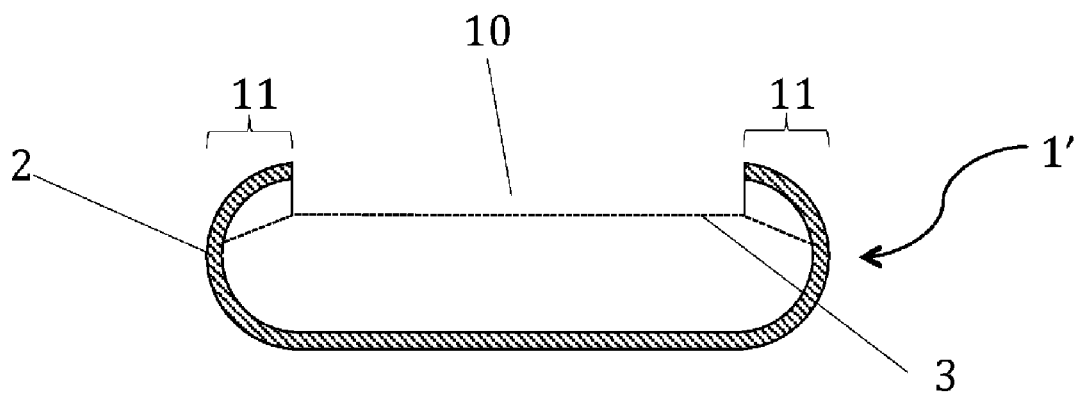
FIG. 2 depicts the remainder obtained after the layer removal.

At the end of this fracturing heat treatment step, and as depicted in FIG. 1E, both the thin layer 5 transferred to the support substrate 4 and a remainder 1', depicted in more detail in FIG. 2, of the donor substrate 1 from which the useful layer 5 was removed are obtained.

The remainder 1' comprises, on a main face 10, an annular step 11 corresponding to a non-removed part of the donor substrate 1. This is a peripheral zone where the degree of adhesion between the donor substrate 1 and the support substrate 4 is insufficient to enable the layer to be removed. The width of the step 11 may range from 0.5 to 3 mm and the height thereof may range from 100 nm to 3.5 micrometers or even 4 micrometers.

The presence of the step 11 and the surface properties of the main face 10 do not enable direct reuse and necessitate the preparation of the remainder 1' before re-use, in particular, in a method of the Smart Cut™ type or a layer transfer method. The present disclosure proposes such a preparation of the remainder 1'.

First Embodiment

Figure 3A:
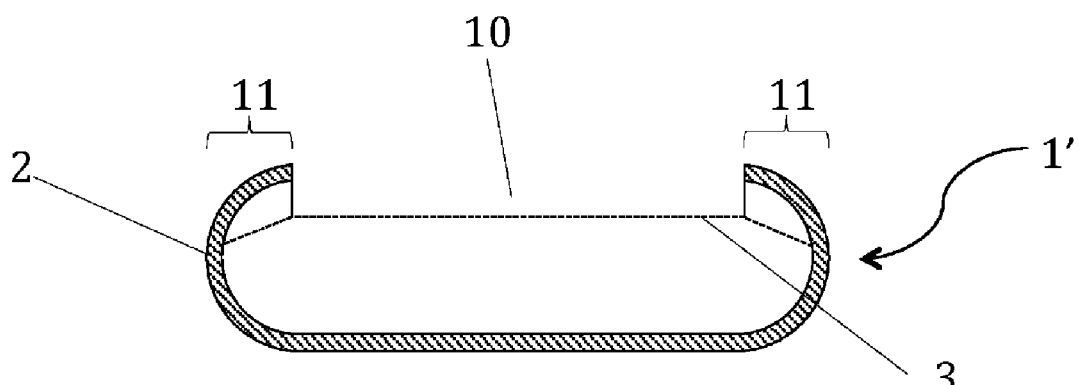
FIGS. 3A and 3B depict the various steps of a first embodiment according to the invention.
Figure 3B:
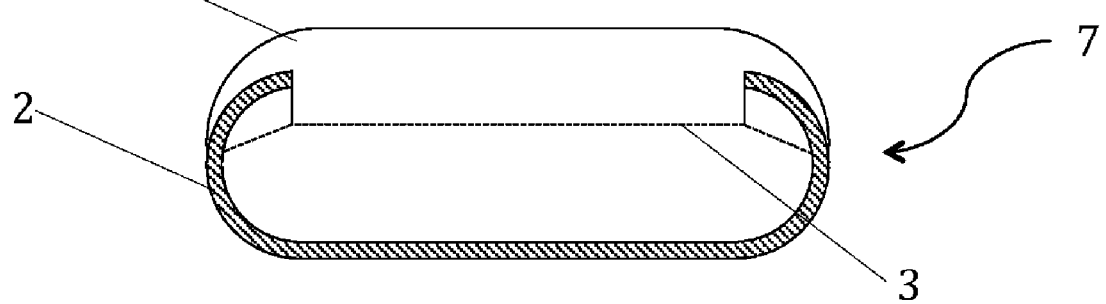

According to a first embodiment, depicted in FIGS. 3A and 3B, the method for preparing the remainder 1' comprises two steps: a deposition of a smoothing oxide 6 on the main face 10 of the remainder 1', and a heat treatment for densification of the smoothing oxide.

The smoothing oxide 6 is generally selected from the SOG (Spin-On Glass) family, which glasses have the property of being in liquid state at room temperature but may be densified, and made solid, using a suitable heat treatment.

The step of deposition of a smoothing oxide 6 consists in depositing a layer of smoothing oxide 6 on the main face 10 of the remainder 1' in order to fill the inner space defined by the annular step 11 and to cover at least part of the annular step 11. The deposition of smoothing oxide 6 may also preferably be carried out under conditions leading to the formation of a layer having a thickness at least equal to one and a half times the height of the annular step 11, as illustrated in FIG. 3B. In order to carry out the planarization of the main surface 10 by the smoothing oxide 6, the remainder 1' is rotated on its support so that it can be distributed by centrifugal force.

The step of densification heat treatment consists in exposing the remainder provided with the layer of smoothing oxide 6 to a temperature of between 225° C. and 850° C., or even 900° C. This heat treatment may last approximately 1 h and be carried out under a nitrogen atmosphere.

At the end of this step, the surface of the smoothing oxide 6 is sufficiently smooth, with a roughness typically of less than 5 Å RMS (AFM measurement 5×5 µm$^2$), to satisfy the requirements of its subsequent use. The layer of smoothing oxide 6 has an elasticity, viscosity and/or breaking strength, which are sufficient to prevent the possible exfoliation of the bubbles associated with the weakened plane present under the step 11 during the densification annealing or during steps leading to the exposure of the treated substrate to high temperatures.

At the end of these treatments, a substrate 7 is obtained, illustrated by FIG. 3B, comprising a remainder 1' of a donor substrate 1, the remainder 1' comprising, on a main face 10, an annular step 11 corresponding to a non-removed part of the donor substrate 1. The remainder 1' may also comprise a surface oxide layer 2 obtained during the steps for transfer of the thin layer 5 from the donor substrate 1 to the support substrate 4. The donor substrate 1 may consist of silicon.

The substrate 7 also comprises an oxide layer 6 on the main face 10 of the remainder 1', the oxide layer 6 filling the inner space defined by the annular step 11 and covering at least part of the annular step 11. Preferably, the oxide layer 6 has a thickness at least equal to one and a half times the height of the annular step 11.

Second Embodiment

According to a second embodiment, depicted in FIGS. 4A to 4D, the method for preparing the remainder 1' comprises an additional step of preparing the main surface 10 of the remainder 1' before the step of deposition of the smoothing oxide 6.

Figure 4A:
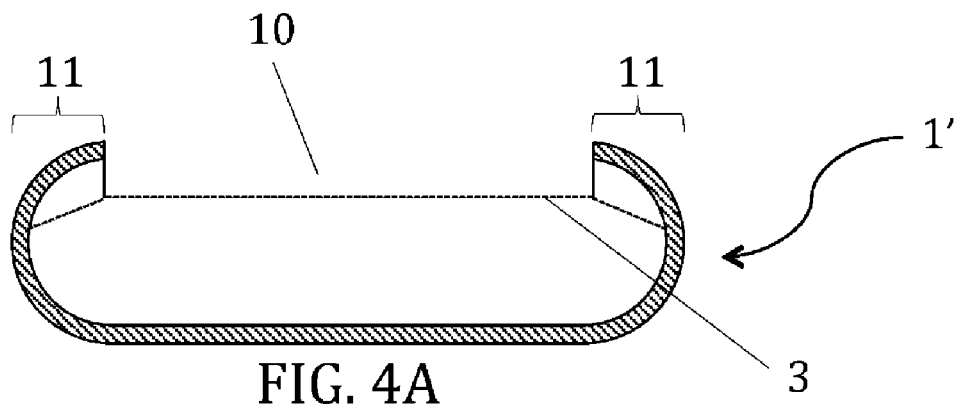
FIGS. 4A-4D depict the various steps of a second embodiment according to the invention.

Indeed, there is a risk of exfoliation of the annular step 11, or of a part thereof, at the residual implantation defects, when the latter remain present in the remainder 1' as can be seen in FIGS. 3A and 4A. This problem may arise with the first embodiment even if it is advantageously reduced by covering the step 11 with the smoothing oxide 6, by virtue, in particular, of its viscosity, elasticity, and breaking strength properties. However, it remains possible to further reduce this risk.

Figure 4B:
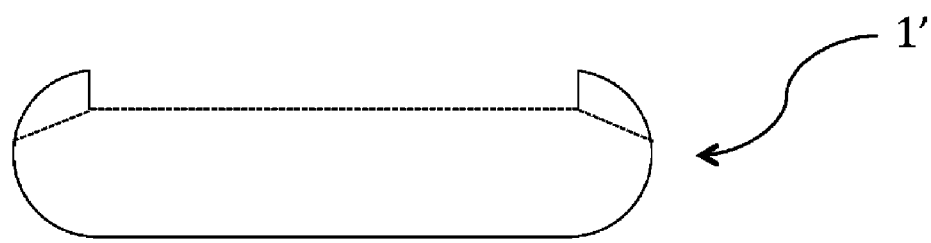
Figure 4C:
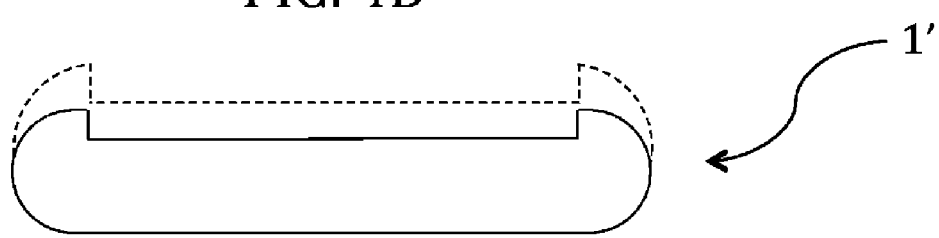

In order to reduce this risk, this second embodiment provides a step of preparing the main surface 10 of the remainder, with the aim of eliminating the part of the step 11 subject to the exfoliation. This step of preparing the main surface 10 of the remainder 1' may thus comprise:

the preliminary removal of the surface oxide layer 2 (FIG. 4B);

elimination of material, for example, by chemical etching, configured to remove a thin layer of the main surface 10 of the remainder 1' and eliminate the part of the step 11 damaged by ion implantation (FIG. 4C). In other words, the step of preparing the main surface 10 comprises the removal of a peripheral zone of this surface, which has been damaged by ion implantation.

The step of removal of the oxide layer, depicted by FIG. 4B, makes it possible to expose the damaged part of the step 11 to be treated. This may, for example, be a wet chemical etching, under cold conditions, of the oxide with a dilute hydrofluoric acid (HF) solution.

The step of chemical etching of the remainder enables the removal of the part of the step 11 damaged by the ion implantation and therefore subject to the exfoliation. This may, for example, be a wet chemical etching, under hot conditions, of the remainder 1' by a basic aqueous solution of TMAH or KOH to remove a thickness of the remainder 1' over a depth at least equivalent to the initial step height.

It is also possible to consider other methods for preparing the surface, such as polishing and/or partial trimming of the plate edge, for example.

This step of preparing the surface implements simple and inexpensive treatments which do not however make it possible to obtain an entirely planar surface. At the end of these treatments, and regardless of the technology used during the surface preparation step, the remainder 1' still has a peripheral topography that defines a residual annular step 11.

At the end of the surface preparation step, the steps described in relation to the first embodiment are reproduced, that is to say that the smoothing oxide is deposited on the main face 10 of the remainder, in order to fill the inner space defined by the annular step 11 and to cover at least part of the annular step 11; and a heat treatment for densification of the smoothing oxide 6 is applied.

Figure 4D:
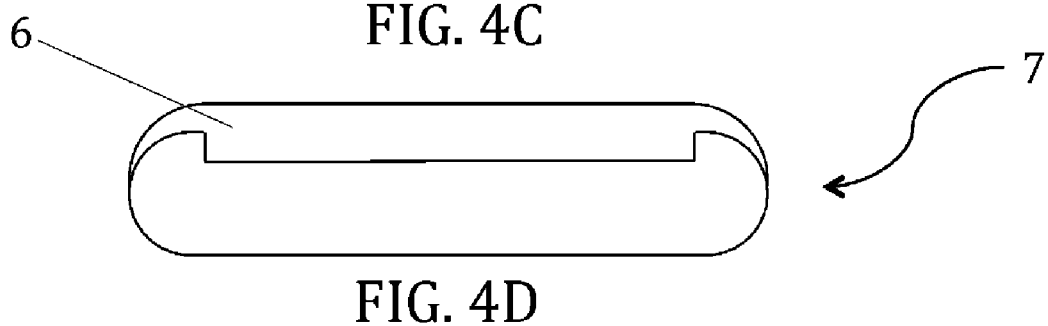

At the end of this method, a substrate 7 is obtained, illustrated by FIG. 4D, comprising a remainder 1' of the donor substrate 1, comprising, on the main face 10 thereof, a residual annular step 11. The remainder 1' may also comprise a surface oxide layer 2 (FIG. 3B). The substrate 7 also comprises an oxide layer 6 on the main face 10 of the remainder 1', the oxide layer 6 filling the inner space defined by the annular step 11 and covering at least part of the annular step 11.

A method in accordance with the present disclosure has the advantage of reducing the loss of material, of not requiring the complete removal of the step 11 of the main face 10 of the remainder 1', and of providing a perfectly planar face. In particular, it is possible to dispense with a step of "double-sided polishing," which is generally necessary in the solutions known in the art. It makes it possible to produce a substrate 7 in a small number of steps, reducing the loss of material, and having satisfactory surface properties to be used, for example, as a recipient substrate for the manufacture of substrates for MEMS.

Use

The substrate 7 produced by a method in accordance with the present disclosure can be used as recipient substrate for the manufacture of a substrate on insulator, for example, of SOI type.

The use of this substrate 7 comprises the assembly thereof with a donor substrate, then the thinning of this donor substrate to form a structure on insulator.

The properties of the smoothing oxide layer 6 make it possible to produce the assembly without applying a high-temperature adhesion heat treatment.

The substrate 7 may thus preferably be used as a support in a layer transfer method, the assembling possibly comprising a heat treatment that may be carried out at low temperature, typically between 100° C. and 900° C. Even more preferentially, the heat treatments are carried out at temperatures of between 100° C. and 500° C., and the transferred layer may then be provided with microelectronics devices for an application in the field of 3D integration.

Of course, the invention is not limited to the embodiments described and variant embodiments can be added thereto without departing from the scope of the invention as defined by the claims.

What is claimed is:

1. A method for preparing a remainder of a donor substrate for reuse, a layer having been removed from the donor substrate by delamination in a plane weakened by ion implantation, the remainder having an annular step corresponding to a non-removed part of the donor substrate on a main face of the remainder of the donor substrate, the method comprising:

depositing a smoothing oxide on the main face of the remainder of the donor substrate and completely filling an inner space defined by the annular step with the smoothing oxide, and covering an entirety of the annular step with the smoothing oxide; and densifying the smoothing oxide by applying a heat treatment to the smoothing oxide.

2. The method of claim 1, wherein the smoothing oxide comprises a spin-on glass.

3. The method of claim 2, wherein applying the heat treatment to the smoothing oxide comprises exposing the smoothing oxide to a temperature of between 225° C. and 900° C.

4. The method of claim 3, wherein applying the heat treatment to the smoothing oxide comprises applying the heat treatment to the smoothing oxide in a nitrogen atmosphere.

5. The method of claim 4, wherein depositing the smoothing oxide comprises forming a layer of the smoothing oxide having a thickness at least equal to one and a half times a height of the annular step.

6. The method of claim 5, further comprising, before depositing the smoothing oxide, removing a peripheral zone of the main surface damaged by ion implantation.

7. The method of claim 1, wherein applying the heat treatment to the smoothing oxide comprises exposing the smoothing oxide to a temperature of between 225° C. and 900° C. C.

8. The method of claim 1, wherein applying the heat treatment to the smoothing oxide comprises applying the heat treatment to the smoothing oxide in a nitrogen atmosphere.

9. The method of claim 1, wherein depositing the smoothing oxide comprises forming a layer of the smoothing oxide having a thickness at least equal to one and a half times a height of the annular step.

10. The method of claim 1, further comprising, before depositing the smoothing oxide, removing a peripheral zone of the main surface damaged by ion implantation.

11. A substrate, comprising:
a remainder of a donor substrate, the remainder comprising an annular step on a main face of the remainder of the donor substrate, the remainder having ion implantation damage at the main face thereof; and
an oxide layer on the main face of the remainder, the oxide layer completely filling the inner space defined by the annular step and covering an entirety of the annular step of the remainder.

12. The substrate of claim 11, wherein the donor substrate comprises silicon.

13. The substrate of claim 11, wherein the oxide layer has a thickness equal to one and a half times a height of the annular step or more.

14. The substrate of claim 11, wherein the annular step has a width in a range extending from 0.5 mm to 3.0 mm.

15. The substrate of claim 11, wherein the annular step has a height in a range extending from 100 nm to 4 μm.

16. The substrate of claim 11, further comprising implanted ions at a weakened plane in the remainder of the donor substrate under the annular step.

17. A method of using a substrate, comprising:
providing a substrate including:
a remainder of a donor substrate having ion implantation damage in a main face of the remainder of the donor substrate, the remainder comprising an annular step corresponding to a non-removed part of the donor substrate on the main face; and
an oxide layer on the main face of the remainder, the oxide layer completely filling an inner space defined by the annular step and covering an entirety of the annular step of the remainder;
assembling the substrate with a donor substrate; and
thinning the donor substrate.

18. The method of claim 17, wherein assembling the substrate with the donor substrate comprises applying a heat treatment at a temperature between 100° C. and 900° C. to the substrate and the donor substrate while the substrate is in contact with the donor substrate.

19. The method of claim 18, wherein applying the heat treatment at the temperature between 100° C. and 900° C. comprises applying the heat treatment at a temperature between 100° C. and 500° C. to the substrate and the donor substrate while the substrate is in contact with the donor substrate.

20. The method of claim 18, wherein the substrate is not subjected to a temperature greater than 900° C.

* * * * *